(12) United States Patent
Suehiro et al.

(10) Patent No.: US 7,497,597 B2
(45) Date of Patent: Mar. 3, 2009

(54) LIGHT EMITTING APPARATUS

(75) Inventors: Yoshinobu Suehiro, Aichi-ken (JP); Hideaki Kato, Aichi-ken (JP); Kunihiro Hadame, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 350 days.

(21) Appl. No.: 11/036,192

(22) Filed: Jan. 18, 2005

(65) Prior Publication Data

US 2005/0161771 A1  Jul. 28, 2005

(30) Foreign Application Priority Data

Jan. 19, 2004  (JP)  ............... 2004-010385

(51) Int. Cl.
*F21V 29/00* (2006.01)

(52) U.S. Cl. ............... 362/294; 362/310; 257/100

(58) Field of Classification Search ............. None
See application file for complete search history.

(56) References Cited

U.S. PATENT DOCUMENTS

| | | | | |
|---|---|---|---|---|
| 2,801,375 | A | * | 7/1957 | Losco ............. 257/763 |
| 3,377,522 | A | * | 4/1968 | Tsuji et al. ............. 361/434 |
| 4,174,491 | A | * | 11/1979 | Nakamura et al. ........ 313/499 |
| 5,391,523 | A | | 2/1995 | Marlor |
| 5,665,983 | A | * | 9/1997 | Nagano ............. 257/81 |
| 5,670,797 | A | | 9/1997 | Okazaki |
| 5,814,837 | A | | 9/1998 | Okazaki |
| 5,882,949 | A | | 3/1999 | Okazaki |
| 6,417,019 | B1 | | 7/2002 | Mueller et al. |
| 2001/0010449 | A1 | | 8/2001 | Chiu et al. |
| 2001/0045573 | A1 | | 11/2001 | Waitl et al. |
| 2003/0013595 | A1 | | 1/2003 | Uehara |
| 2003/0050177 | A1 | | 3/2003 | Uehara |
| 2003/0122482 | A1 | | 7/2003 | Yamanaka et al. |
| 2006/0012299 | A1 | * | 1/2006 | Suehiro et al. ............. 313/512 |
| 2006/0261364 | A1 | * | 11/2006 | Suehiro et al. ............. 257/100 |

FOREIGN PATENT DOCUMENTS

| | | |
|---|---|---|
| DE | 195 44 980 | 6/1996 |
| EP | 0 078 658 | 10/1982 |
| JP | 48-29383 | 4/1973 |
| JP | 49-053387 A | 5/1974 |
| JP | 49-31278 | 8/1974 |
| JP | 58-84134 | 5/1983 |
| JP | 61-96780 | 5/1986 |

(Continued)

OTHER PUBLICATIONS

Japanese Office Action dated Feb. 20, 2007, with partial English translation.

(Continued)

*Primary Examiner*—Thomas M Sember
(74) *Attorney, Agent, or Firm*—McGinn IP Law Group, PLLC (57) ABSTRACT

A light emitting apparatus has a light emitting element, and a transparent glass section and a metal section that surround the light emitting element. The transparent glass section and the metal section have a ratio in thermal expansion coefficient to the light emitting element in a range of 150% to 500%.

22 Claims, 7 Drawing Sheets

FOREIGN PATENT DOCUMENTS

| | | |
|---|---|---|
| JP | 63-31557 | 3/1988 |
| JP | 63-067792 A | 3/1988 |
| JP | 5-315652 | 11/1993 |
| JP | 05-343744 | 12/1993 |
| JP | 6-289321 | 10/1994 |
| JP | 07-78658 | 3/1995 |
| JP | 07-099294 | 4/1995 |
| JP | 7-99294 | 4/1995 |
| JP | 7-169994 | 7/1995 |
| JP | 8-102553 A | 4/1996 |
| JP | 9-283803 | 10/1997 |
| JP | 10-135492 | 5/1998 |
| JP | 10-190190 | 7/1998 |
| JP | 10-190190 A | 7/1998 |
| JP | 11-040848 | 2/1999 |
| JP | 11-116275 | 4/1999 |
| JP | 11-307692 | 5/1999 |
| JP | 11-177129 | 7/1999 |
| JP | 11-177129 A | 7/1999 |
| JP | 11-204838 | 7/1999 |
| JP | 11-289098 | 10/1999 |
| JP | 2000-233939 | 8/2000 |
| JP | 2000-239801 | 9/2000 |
| JP | 2000-239801 A | 9/2000 |
| JP | 2000-340876 | 12/2000 |
| JP | 2001-15773 | 1/2001 |
| JP | 2001-97737 | 4/2001 |
| JP | 2001-098144 | 4/2001 |
| JP | 2001-98144 | 4/2001 |
| JP | 2001-98144 A | 4/2001 |
| JP | 2001-217467 | 8/2001 |
| JP | 2002-9347 | 1/2002 |
| JP | 2002-009347 | 1/2002 |
| JP | 2002-055211 | 2/2002 |
| JP | 2002-94123 A | 3/2002 |
| JP | 2002-094128 | 3/2002 |
| JP | 2002-348133 | 4/2002 |
| JP | 2002-134792 A | 5/2002 |
| JP | 2002-134821 | 5/2002 |
| JP | 2002-374006 | 12/2002 |
| JP | 2003-8071 | 1/2003 |
| JP | 2003-008071 | 1/2003 |
| JP | 2003-20249 | 1/2003 |
| JP | 2003-34791 | 2/2003 |
| JP | 2003-54983 | 2/2003 |
| JP | 2003-133596 | 5/2003 |

OTHER PUBLICATIONS

Notification of Reasons for Refusal dated Mar. 27, 2007 with partial English translation.
Chinese Office action for Application No. 200480006403.1, mailed on Jul. 6, 2007, with English translation.
Japanese Office Action dated Mar. 27, 2007 with partial English language translation.
Japanese Office Action dated Nov. 6, 2007 with partial English language translation.
Japanese Office Action dated Sep. 18, 2007, with partial English language translation.
Japanese Office Action dated Sep. 18, 2007, with partial English language translation.
Japanese Office Action dated Mar. 11, 2008 with partial English language translation.

* cited by examiner

LIGHT EMITTING APPARATUS

The present application is based on Japanese patent application No. 2004-010385, the entire contents of which are incorporated herein by reference.

BACKGROUND OF THE INVENTION

1. Field of the Invention

This invention relates to a light emitting apparatus and, in particular, to a light emitting apparatus that allows the prevention of a crack etc. caused by a thermal expansion difference between a seal member and a lead due to heat generation in a high-output type light emitting section.

2. Description of the Related Art

A typical light emitting apparatus with an LED (light-emitting diode) as a light source is provided with a transparent seal member that covers in a predetermined range a LED element and a lead. The seal member is of epoxy resin, silicone resin, glass etc. Resins are generally used because they are advantageous in aspects of molding, mass production and cost.

Recently, since blue LED's are developed which have brightness as high as a red or green LED, LED elements are increasingly used for a traffic light, a white lamp etc. Further, high-output type LED elements are developed which have a higher brightness, and a high-output LED of several watts is already produced. Due to its large current flow, the high-output type LED element is subjected to heat generation unignorable in emission characteristic and durability.

In using such a high-output type LED element for an LED lamp, it is known that a resin packaging material is subjected to deterioration such as yellowing of resin, or cracking due to a thermal expansion difference between the respective members, or peeling between the respective members. As the output of LED element increases, such a problem will be worse. Therefore, a high-output LED lamp is desired which has a good durability.

Japanese patent application laid-open No. 11-204838 discloses an LED lamp that a glass packaging material is used to solve the problems in the resin packaging material, such as yellowing of rein, to have improved heat resistance and durability (See FIG. 1 thereof).

However, the conventional light emitting apparatus with glass packaging material has problems as stated below.

In sealing an LED element with a glass material, the glass material is softened and pressed or fused and molded to be integrated with the LED element. The sealed object is subjected to heat in the sealing and thereby it is in thermal expansion. In this state, it is integrated with the glass material without having a stress and then cooled down to room temperature. At this stage, if a thermal expansion difference exists between the LED element and its mounting substrate, its junction interface may be subjected to excessive stress due to a thermal contraction difference. As a result, a bonding failure will be generated therebetween or cracking will be generated in the glass seal material.

SUMMARY OF THE INVENTION

It is an object of the invention to provide a light emitting apparatus that is not affected by the thermal expansion or thermal contraction even when it uses a glass seal material.

(1) According to one aspect of the invention, a light emitting apparatus comprises:

a light emitting element; and a transparent glass section and a metal section that surround the light emitting element, wherein the transparent glass section and the metal section comprise a ratio in thermal expansion coefficient to the light emitting element in a range of 150% to 500%.

The metal section may have a current supplying section to supply current to the light emitting element, and a heat radiation section to radiate heat generated from the light emitting element.

The current supplying section may be integrated with the heat radiation section.

The metal section may have a thermal expansion coefficient nearly equal to that of the transparent glass section.

The metal section may be of a soft metal.

(2) According to another aspect of the invention, a light emitting apparatus comprises:

a light emitting element;

a current supplying section on which the light emitting element is mounted and which supplies power to the light emitting element;

a transparent glass section that seals the light emitting element and part of the current supplying section;

wherein the current supplying section and the transparent glass section comprise a material that comprises a thermal expansion coefficient greater than the light emitting element, and the light emitting element is surrounded by the current supplying section and the transparent glass section.

(3) According to another aspect of the invention, a light emitting apparatus comprises:

a light emitting element;

a submount on which the light emitting element is mounted;

a current supplying section that supplies power to the light emitting element;

a transparent glass section that seals the light emitting element, the submount and part of the current supplying section;

wherein the submount comprises an electrical circuit through which power is supplied from the current supplying section to the light emitting element, the current supplying section and the transparent glass section comprise a material that comprises a thermal expansion coefficient greater than the light emitting element or the submount, and the light emitting element and the submount are surrounded by the current supplying section and the transparent glass section.

The current supplying section may have a thermal expansion coefficient nearly equal to that of the transparent glass section.

The current supplying section may be of a soft metal.

The current supplying section may have a thermal conductivity of 100 $W \cdot m^{-1} \cdot k^{-1}$ or more.

The submount may have a thermal conductivity of 100 $W \cdot m^{-1} \cdot k^{-1}$ or more.

The current supplying section and the transparent glass section may of a material that has a ratio in thermal expansion coefficient 150% or more greater than the light emitting element or the submount.

ADVANTAGES OF THE INVENTION

In the light emitting apparatus of the invention, the light emitting element (LED element) is surrounded in its whole periphery by the transparent glass section (seal member) and the metal section (lead) that have a ratio in thermal expansion coefficient to the light emitting element in a range of 150% to 500%. Thereby, the direction of stress generated can be adjusted to prevent a failure such as a cracking caused by the thermal contraction difference.

Alternatively, the light emitting element (LED element) is surrounded in its whole periphery by the transparent glass section (seal member) and the current supplying section (lead) that have a thermal expansion coefficient greater than the light emitting element. Thereby, the direction of stress generated can be adjusted to prevent a failure such as a cracking caused by the thermal contraction difference.

Alternatively, the transparent glass section (seal member) and the current supplying section (lead) have a thermal expansion coefficient greater than the light emitting element or the submount. Thereby, the direction of stress generated can be adjusted to prevent a failure such as a cracking caused by the thermal contraction difference.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
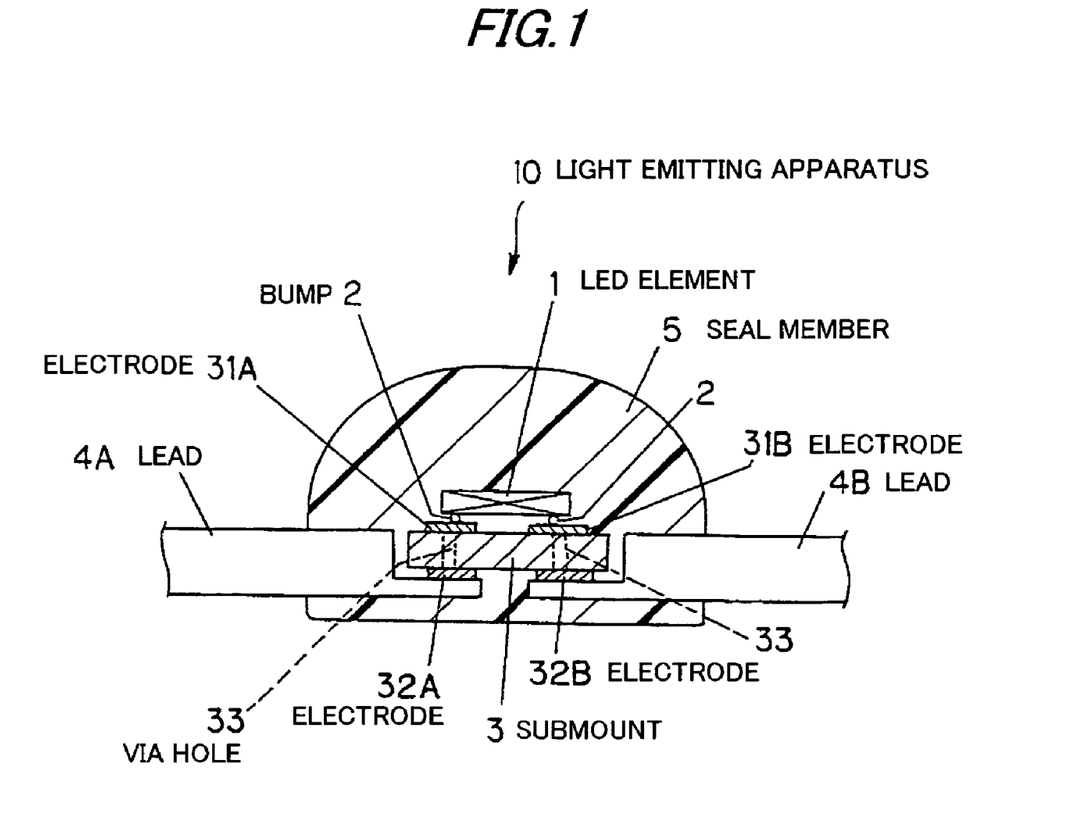
FIG. 1 is a cross sectional view showing a light emitting apparatus in a first preferred embodiment of the invention.

FIG. 1 is a cross sectional view showing a light emitting apparatus in the first preferred embodiment of the invention.

Although strip portions to connect outer portions of leads are generally provided on both sides of a lead frame, they are omitted in FIG. 1. Further, although a plurality of LED elements are generally provided on the lead frame, only one of them is shown herein. In FIG. 1, a submount is not shown in cross section.

The light emitting apparatus 10 is a metal lead mount type, and it is composed of: a GaN based LED element 1 (with a thermal expansion efficient of 4.5 to $6 \times 10^{-6}/°$ C.) that is flip-chip bonded to through a bump to the mounting surface; a submount 3 on which the LED element 1 is mounted; leads 4A, 4B (with a thermal expansion coefficient of 15 to $17 \times 10^{-6}/°$ C. and a thermal conductivity of 400 $W \cdot m^{-1} \cdot k^{-1}$) which are of copper so as to be power supply members and on which the submount 3 is mounted; and a seal member 5 which is of transparent glass and seals the periphery of the LED element 1 placed at the center.

The submount 3 is, for example, of AlN (aluminum nitride with a thermal expansion coefficient of $5 \times 10^{-6}/°$ C. and a thermal conductivity of 180 $W \cdot m^{-1} \ k^{-1}$). Electrodes 31A, 31B connected to the bumps 2 are formed thereon on the mounting side of the LED element 1. Electrodes 32A, 32B are also formed thereon on the opposite surface (a surface on the lead frame side) to be connected with a pair of the leads 4A, 4B. An end region in the upper surface of the leads 4A, 4B on which the LED element 1 is mounted is formed stepwise lower than the other region thereof, and the submount 3 is mounted in the depressed end region. Further, through holes (via holes) 33 are formed in the submount 3 to connect the electrodes 31A, 31B with the electrodes 32A, 32B.

The seal member 5 is formed as a transparent glass section to seal the LED element 1, the submount 3 and part of the leads 4A, 4B by fusion-bonding a sheet glass material that is transparent and has a low melting point and a thermal expansion coefficient close to that of the leads 4A, 4B (or in a predetermined range of thermal expansion difference from the leads 4A, 4B).

In operation, when the lead 4A is a positive (+) power supply terminal, current supplied to the lead 4A is flown through the lead 4A, one of the electrodes 32A, 32B, one of the via holes 33 one of the electrodes 31A, 31B and one of he bumps 2 to the anode of the LED element 1. Further, current flowing out of the cathode of the LED element 1 is flown through the other of bumps 2, the other of the electrodes 31A, 31B, the other of the via holes 33 and the other of the electrodes 32A, 32B to the lead 4B. Thereby, the LED element 1 can emit light.

Figure 2:
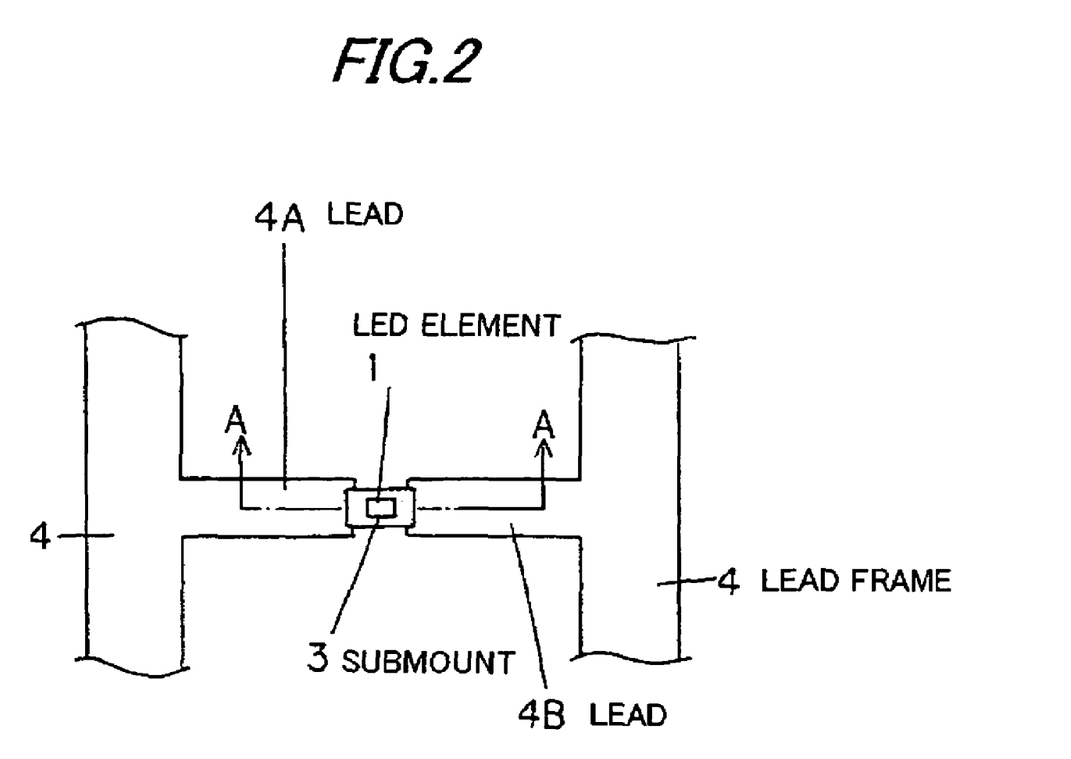
FIG. 2 is a plain view showing a lead frame with a submount placed thereon.

FIG. 2 is a plain view showing the lead frame 4 with the submount 3 mounted thereon. The submount 3 mounts the LED element 1 at the central portion thereof. The leads 4A, 4B are formed opposed to each other with a predetermined interval and extending inside as part of the lead frame 4 from the lateral strip portions. As shown, a pair of the leads 4A, 4B is assigned to the one LED element 1.

Figure 3:
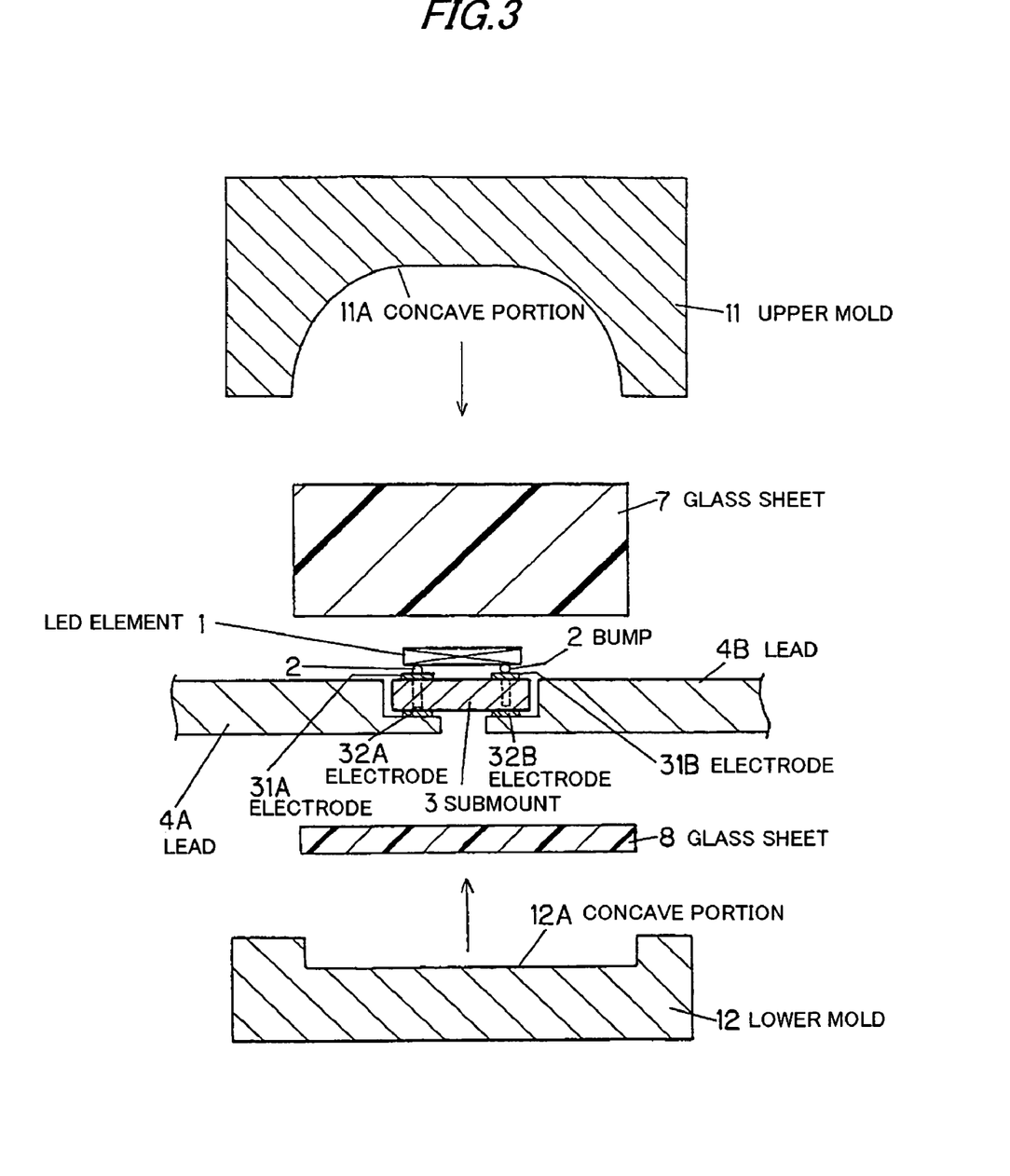
FIG. 3 shows a situation before conducting the glass-sealing of an LED element by using a mold, where parts are shown in a cross section cut along a line A-A in FIG. 2.

FIG. 3 shows a situation just before conducting the glass-sealing of an LED element by using a mold, where parts are shown in a cross section cut along a line A-A in FIG. 2.

The method of fabricating the light emitting apparatus 10 will be explained below, referring to FIGS. 1 to 3.

First, the LED element 1 with the bumps 2 is positioned on the submount 3, and the bumps 2 are electrically connected to the electrodes 31A, 31B by reflowing and then are mechanically fixed to them.

Then, the LED element 1 mounted on the submount 3 is disposed in the depressed portion of the end portion of the leads 4A, 4B while adjusting the current supplying direction. The submount 3 is previously provided with the electrodes 31A, 31B, the electrodes 32A, 32B and the via holes 33.

Then, the lead frame 4 is placed in the mold and glass sheets 7, 8 are placed above and below the LED element 1. The glass sheets 7, 8 are used to form the seal member 5 and have such a size that a plurality of the LED elements 1 can be sealed simultaneously.

Then, an upper mold 11 is disposed to cover the glass sheet 7 and a lower mold 12 is disposed to cover the glass sheet 8. Then, softening the glass sheets 7, 8 by heating them at 450° C. in a vacuum atmosphere, the upper mold 11 and the lower mold 12 are moved in arrowed directions in FIG. 3 to press the glass sheets 7, 8. Thereby, the glass sheets 7, 8 are molded along a concave 11A of the upper mold 11 and a concave 12A of the lower mold 12 to form a dome as the seal member 5 in FIG. 1.

Then, by removing unnecessary portions such as the strip portion of the lead frame 4, each of the light emitting apparatuses 10 is separated from the lead frame 4.

In operation, when a forward voltage is applied to the light emitting apparatus 10 through the bumps 2 electrically connected to a pad electrode (not shown) and a n-type electrode (not shown) of the LED element 1, the carrier recombination of hole and electron is generated in an active layer (not shown) of the LED element 1 to emit light. The emitted light is radiated outside of the LED element 1 while passing through a sapphire substrate (not shown) of the LED element 1. The radiated light is then externally radiated passing through the seal member 5.

The following effects can be obtained by the first embodiment.

(1) Since the LED element 1 having a small thermal expansion coefficient is sealed with the seal member 5 of the glass material having a large thermal expansion coefficient while surrounding the entire surface of the LED element 1, an internal stress caused by the thermal expansion difference therebetween can be controlled such that it is generated toward the center of the LED element 1. Therefore, even if the internal stress is generated due to the thermal contraction of the glass material after the glass molding, the internal stress is controlled to be a compressing force toward the center of the LED element 1. Since the glass member has a sufficient strength to the compressing force, it can offer a glass seal structure that is not subjected to cracking.

(2) The LED element 1 having a small thermal expansion coefficient is mounted on the submount 3 having a small thermal expansion coefficient and the submount 3 is mounted on the leads 4A, 4B having a large thermal expansion coefficient. Although the glass material of the seal member 5 needs to have a bonding performance to both the LED element 1 having a small thermal expansion coefficient and the leads 4A, 4B having a large thermal expansion coefficient, it preferably has a thermal expansion coefficient closer to that of the LED element 1 rather than that of the leads 4A, 4B. When the leads 4A, 4B are of soft metal such as copper to have elasticity more than the glass material, if the thermal expansion difference to the LED element 1 and the submount 3 is in the range of 150% to 400%, a stress caused by the thermal contraction difference can be absorbed in structure while keeping a good bonding performance to the glass material. Thus, even when the leads 4A, 4B are sandwiched and sealed with the glass materials, no failure such as clacking is generated.

(3) Even when a large current is supplied to the LED element 1 and therefore its heat generation increases, heat generated from the LED element 1 can be efficiently radiated outward and the reduction of emission efficiency can be effectively prevented. Especially, these effects can be obtained when the thermal conductivity of the submount 3 and the leads 4A, 4B is 100 $W \cdot m^{-1} \cdot k^{-1}$ or more.

(4) Since the seal member 5 is made of the glass sheets 7, 8 with a low melting point, the time required for heating can be shortened and a heating device used therefor can be downsized. Thus, the glass sealing can be easily conducted.

(5) Since it becomes less likely to have a failure such as cracking in the process of fabrication or thereafter, a high sealing performance can be stably kept by the glass material for a long period. Thus, the emission efficiency is not reduced even in water or under a humid condition, and a good durability can be obtained for a long period.

Although in the first embodiment the GaN based LED element 1 is used, another type of LED element may be used.

In the first embodiment, the submount 3 of AlN is mounted on the leads 4A, 4B of copper. However, for example, the submount 3 of silicon (with a thermal conductivity of 170 $W \cdot m^{-1} \cdot k^{-1}$) may be mounted on the leads 4A, 4B of brass (with a thermal conductivity of 106 $W \cdot m^{-1} \cdot k^{-1}$).

Although the seal member 5 is formed by using the glass sheets 7, 8 to seal together a plurality of the LED elements 1 and the submounts 3, it may be formed by supplying fused glass around the LED element 1 and the submount 3 and then hot-pressing with the upper mold 11 and the lower mold 12. The glass material may be not colorless and transparent if it has a light transmitting property, and may be colored.

The seal member 5 may have various shapes according to the specification of the light emitting apparatus 10. For example, it may be round, elliptic or rectangular. Also, it may be formed with a lens or no lens.

Although the first embodiment is addressed to the flip-chip type light emitting apparatus with the metal leads as a power supply member, it can be applied to a face-up (FU) type light emitting apparatus using bonding wires as the power supply member.

Figure 4A:
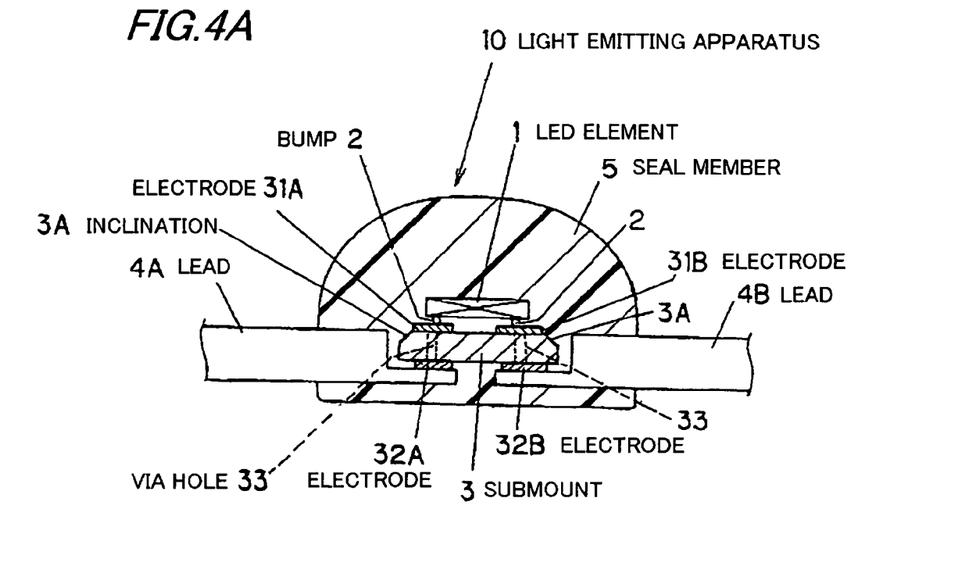
FIGS. 4A, 4B and 4C are a cross sectional view, an enlarged plain view and an enlarged cross sectional view showing a modification of the light emitting apparatus of the first embodiment.
Figure 4B:
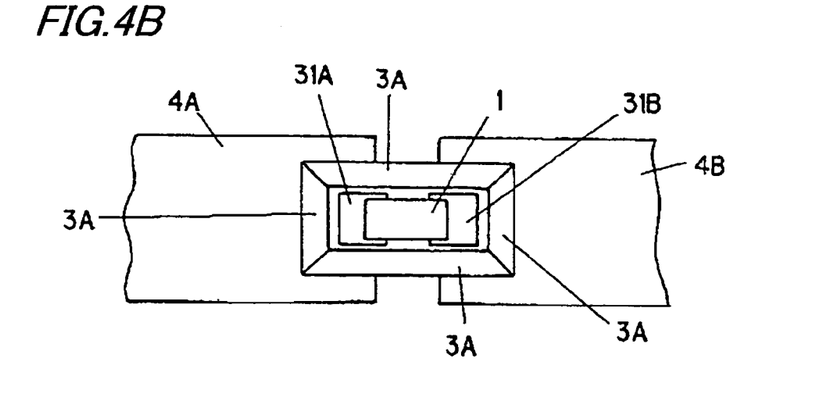
Figure 4C:
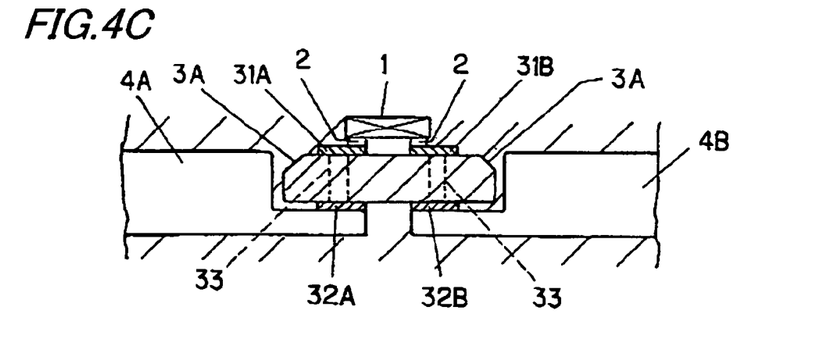

FIGS. 4A, 4B and 4C are a cross sectional view, an enlarged plain view and an enlarged cross sectional view showing a modification of the light emitting apparatus of the first embodiment.

In this modification, the light emitting apparatus 10 is provided with the submount 3 with an inclination 3A formed by removing the corner of the submount 3 in FIG. 1 so as to prevent a cracking caused by the thermal expansion and thermal contraction of the seal member 5. By using such a submount 3, the glass sealed light emitting apparatus 10 can have the property that the cracking can be further prevented, as well as the effects of the first embodiment.

Figure 5:
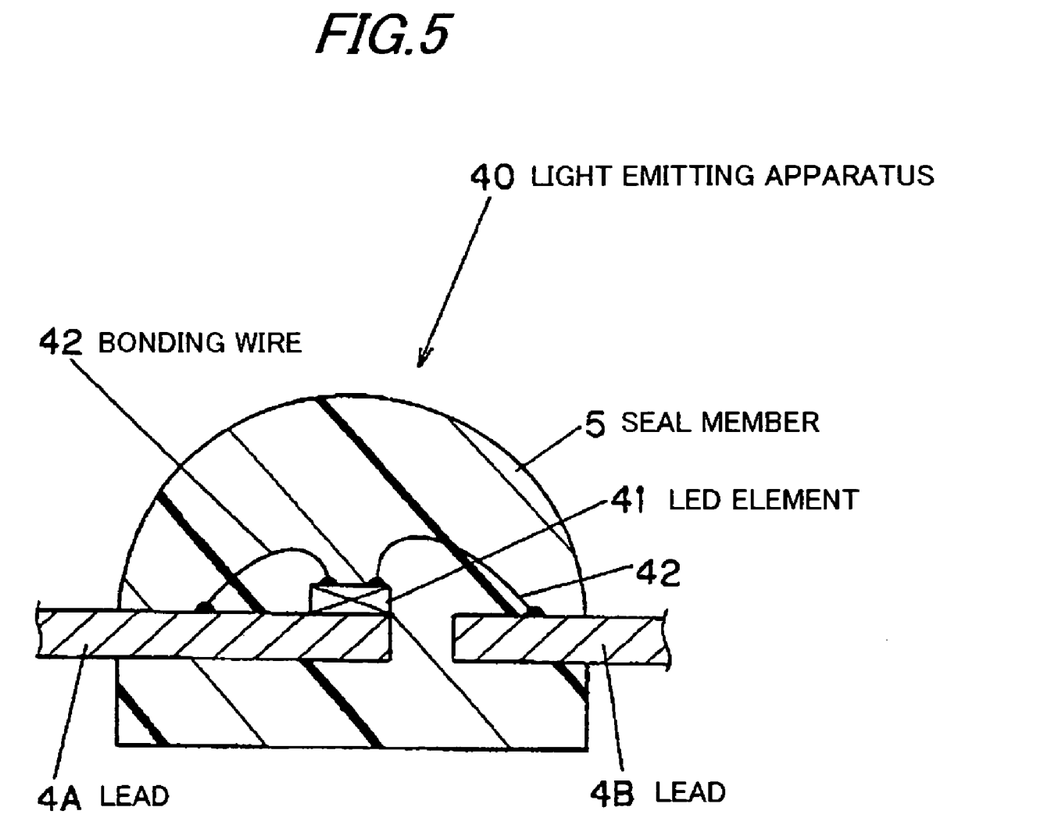
FIG. 5 is cross sectional view showing a face-up type light emitting apparatus in a second preferred embodiment of the invention.

FIG. 5 is cross sectional view showing a face-up type light emitting apparatus 40 in the second preferred embodiment of the invention. In FIG. 5, like components are indicated by the same numerals as used in FIG. 1.

The light emitting apparatus 40 is composed of: the leads 4A, 4B as power supply members which are disposed horizontally and linearly while having a gap between the tip portions thereof; a GaN based LED element 41 that is mounted through an adhesive etc. on the upper surface of the tip portion of the lead 4A; bonding wires 42 that connect two electrodes (not shown) on the LED element 41 with the leads 4A, 4B; and the seal member 5 that is of a glass material and seals the LED element 41 and part of the leads 4A, 4B.

The seal member 5 is of the glass material that is transparent and has a low melting point and a thermal expansion coefficient in the predetermined range. Especially in the face-up type, due to using the bonding wires, the wires 42 and wire connecting portions 42A are likely to be crushed by pressing since they are softened by heat in the glass sealing. Thus, the short-circuiting may be generated. Therefore, it is desired that the glass material has a melting point lowered as much as possible.

The method of fabricating the light emitting apparatus 40 will be explained below.

With the lead frame 4 not separated, the LED element 41 is mounted on the tip portion of the lead 4A. Then, one of the electrodes on the LED element 41 is connected through the bonding wire 42 to a point on the upper surface of the lead 4A, and the other of the electrodes on the LED element 41 is connected through the bonding wire 42 to a point on the upper surface of the lead 4B. Then, as explained earlier in the first embodiment, the molding of the glass material is conducted using the molds 11, 12 to form a predetermined shape of the seal member 5. Finally, by separating the unnecessary portions of the lead frame 4, each of the light emitting apparatus 40 is separated from the lead frame 4.

In FIG. 5, for example, when the lead 4A is an anode, the positive side of a DC power source (not shown) is connected to the lead 4A, and the negative side thereof is connected to the lead 4B. By supplying current therethrough, the LED element 41 emits light. The emitted light is radiated from the upper surface of the LED element 41, and it is mostly radiated outward passing through the seal member 5 and is partly radiated outside of the seal member 5 after being reflected inside of the seal member 5.

In the second embodiment, even though being a face-up type, the light emitting apparatus 40 can have the effect that the separation or cracking can be effectively prevented by considering the thermal expansion coefficient of the leads 4A, 4B and the seal member 5 and using the low melting glass material, as well as the effects of the first embodiment.

In the first and second embodiments, the leads 4A, 4B may be provided with a reflection surface formed thereon so as to enhance the light radiation efficiency. Further, the seal member 5 may be provided with a wavelength conversion section formed therein and over the LED element 1, 41, the section including a phosphor to be excited by light of a predetermined wavelength.

Although, in the first and second embodiments, the number of the LED element disposed in the one seal member 5 is one, a multi-emission type light emitting apparatus can be composed such that two or more LED elements are disposed in the one seal member 5. In such a case, the light emitting apparatus is suitably of flip-chip type as shown in FIG. 1. Further, the multiple LED elements mounted may each have different emission colors or a same emission color.

Further, in the driving form of LED element, the multiple LED elements may be connected in parallel all or in groups, or connected in series all or in groups.

Although the seal member 5 is formed semispherical with a lens section on the top, it may be formed with no lens, or formed into an arbitrary shape such as polygonal and cylindrical.

Although the seal member 5 is formed using the glass sheet, it may be formed using another sealing method.

Figure 6A:
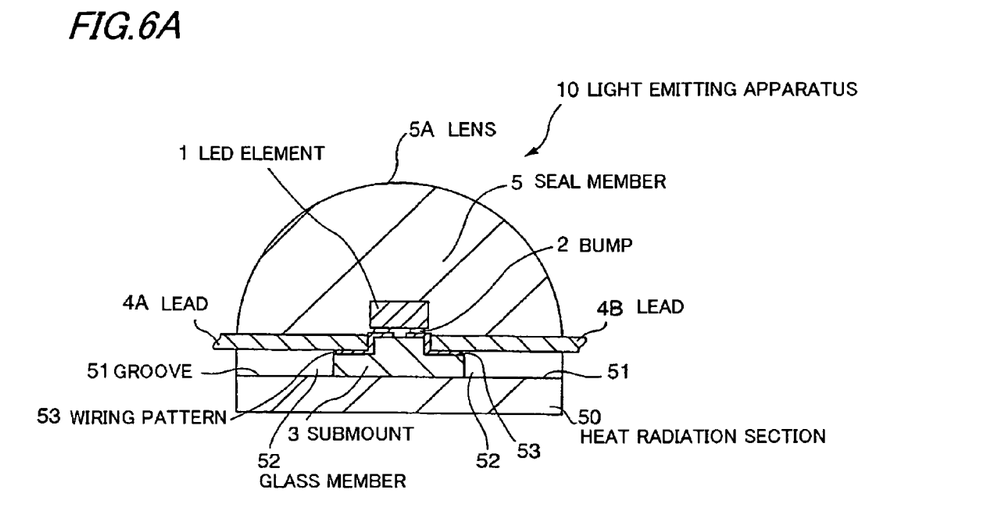
FIG. 6A is a cross sectional view showing a flip-chip type light emitting apparatus in a third preferred embodiment of the invention.
Figure 6B:
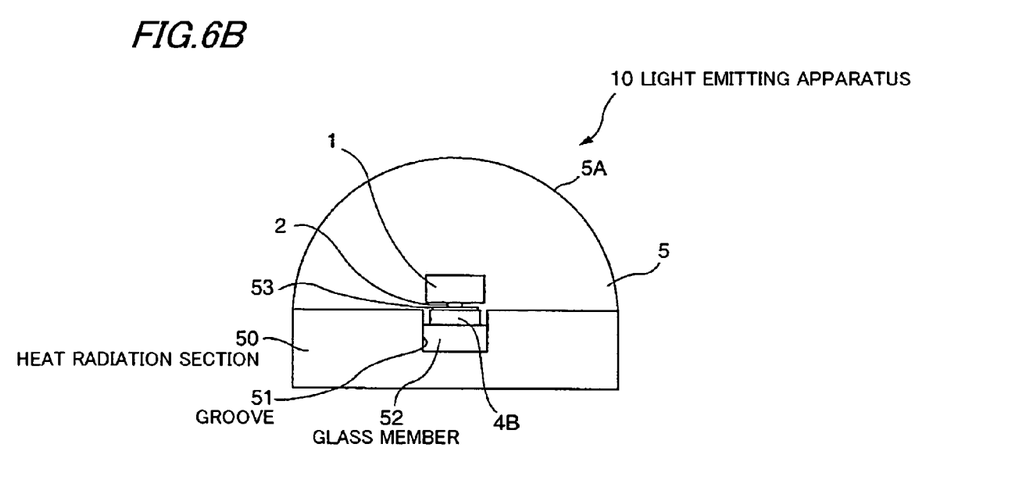
FIG. 6B is a side view showing the light emitting apparatus of the third embodiment viewed from the right side in FIG. 6A.

FIG. 6A is a cross sectional view showing a flip-chip type light emitting apparatus 10 in the third preferred embodiment of the invention. FIG. 6B is a side view showing the light emitting apparatus of the third embodiment viewed from the right side in FIG. 6A. In FIGS. 6A and 6B, like components are indicated by the same numerals as used in FIG. 1.

As shown in FIG. 6A, the light emitting apparatus 10 is composed such that the submount 3 is mounted on a heat radiation section 50 of copper, and the seal member 5 of low melting glass seals integrally the components of the apparatus, and the seal member 5 is formed with a lens 5A on the top.

The submount 3 is placed in a groove 51 formed in the heat radiation section 50, and is provided with a wiring pattern 53 formed on the surface such that the wiring pattern 53 is electrically connected through the bumps 2 to the electrodes of the LED element 1 to compose part of the power supply member.

The wiring pattern 53 is solder-bonded to the leads 4A, 4B of copper as soft metal after being bonded to the LED element 1. The lead 4B is hot-pressed with the seal member 5 in such a state that it is isolated from the heat radiation section 50 by placing a bar-like glass material 52 with an rectangular cross section under the lead 4B, as shown in FIG. 6B. In like manner, the lead 4A is hot-pressed. Thus, the leads 4A, 4B are integrated by using the glass material and the seal member 5 melted by the hot pressing while being isolated from the heat radiation section 50.

In the third embodiment, adding to the effects of the first embodiment, the following effects can be obtained.

Since the heat radiation section 50 with the submount 3 mounted thereon is integrally sealed with the seal member 5 of glass material, the heat radiation performance for heat transmitted from the submount 3 can be enhanced. The heat radiation performance can be utilized not only in the process of glass sealing but also when the heat generation from the LED element 1 increases as the output of the LED element 1 increases. This also allows the prevention of a package cracking in the light emitting apparatus 10 due to the thermal expansion difference.

Although in the third embodiment the heat radiation section 50 is made of copper, it may be made of a material, such as copper alloys and aluminum, that has a good thermal conductivity and a small difference in thermal expansion coefficient from the seal member 5. For example, when the heat radiation section 50 is of aluminum, the difference in thermal expansion coefficient of the heat radiation section 50 to the LED element 1 and the submount 3 is about 500%.

Figure 7A:
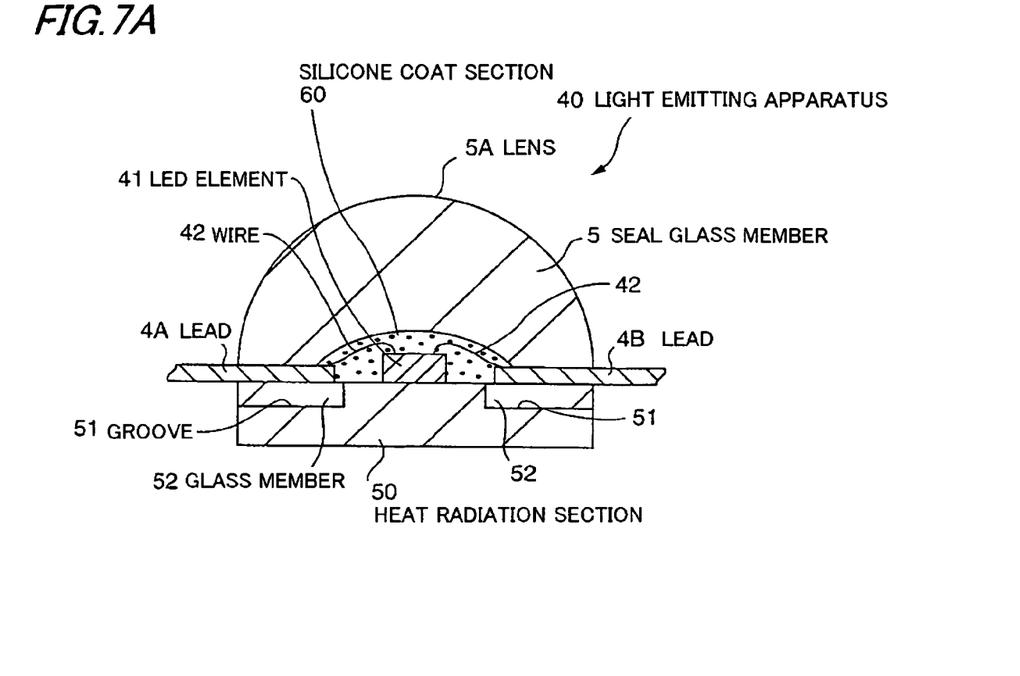
FIG. 7A is a cross sectional view showing a face-up type light emitting apparatus in a fourth preferred embodiment of the invention.
Figure 7B:
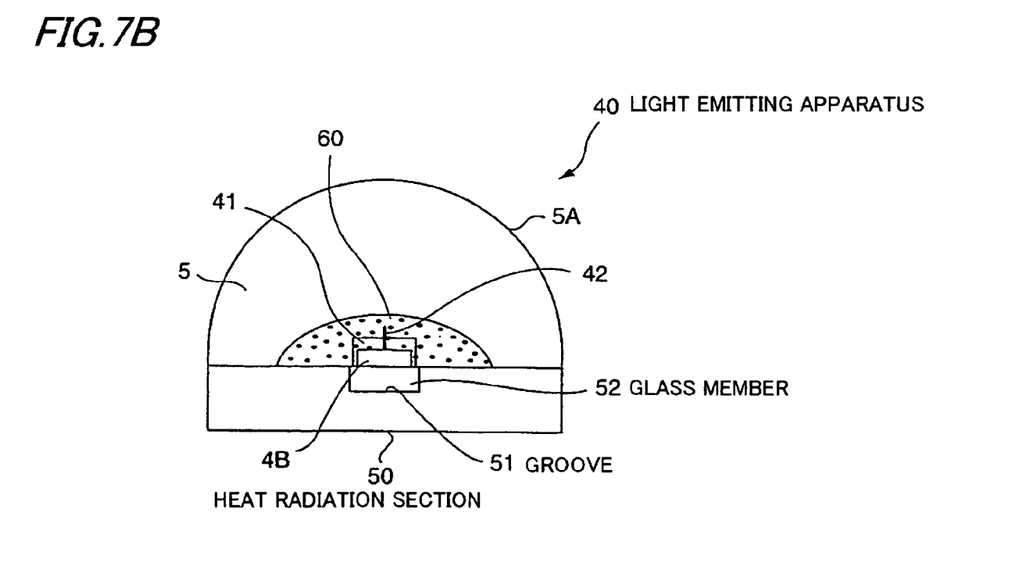
FIG. 7B is a side view showing the light emitting apparatus of the fourth embodiment viewed from the right side in FIG. 7A.

FIG. 7A is a cross sectional view showing a face-up type light emitting apparatus 40 in the fourth preferred embodiment of the invention. FIG. 7B is a side view showing the light emitting apparatus 40 of the fourth embodiment viewed from the right side in FIG. 7A. In FIGS. 7A and 7B, like components are indicated by the same numerals as used in the second embodiment.

The light emitting apparatus 40 is, as shown in FIG. 7A, composed such that the LED element 41 is attached to the center of the heat radiation section 50 of copper, and the leads 4A, 4B to supply power to the LED element 41 are electrically connected through the wires 42 to the electrodes of the LED element 41. Further, a silicone coat section 60 is disposed such that it covers the LED element 41, the wires 42 and the leads 4A, 4B to give them a heat resistance against heat generated in the process of low melting glass sealing. The seal member 5 is integrated with the heat radiation section 50 while covering the silicone coat section 60. The seal member 5 is formed with the lens 5A.

In the fourth embodiment, adding to the effects of the second embodiment, the following effects can be obtained.

Even though the light emitting apparatus 40 is a face-up type, since the silicone coat section 60 having a heat resistance and an elasticity covers the periphery of the LED element 41, the glass sealing can be conducted to prevent the deformation of the electrodes of the LED element 41 and the wires 42 caused by the compression in the process of glass sealing. Therefore, the mounting workability thereof is excellent. Further, the heat radiation performance can be developed not only in the process of glass sealing but also when the heat generation from the LED element 41 increases as the output of the LED element 1 increases. This also allows the prevention of a package cracking in the light emitting apparatus 10 due to the thermal expansion difference. The silicone coat section 60 may contain a phosphor.

Although in the fourth embodiment power is supplied to the LED element 41 mounted on the heat radiation section 50 through a pair of the leads 4A, 4B, the power supply composition may be such that one of the leads 4A, 4B is integrated with the heat radiation section 50 and the other of the leads 4A, 4B and the heat radiation section 50 are insulated with the glass material 52.

Instead of silicone rein coat material, the section 60 may be of another material such as a ceramic coat material. The coat material construction may be applied to the flip-chip type LED element other than the face-up type LED element.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting apparatus comprising:
a light emitting element; and
a transparent glass section and a metal section that surround the light emitting element,
wherein the transparent glass section and the metal section comprise a ratio in thermal expansion coefficient to the light emitting element in a range of 150% to 500%.

2. The light emitting apparatus according to claim 1, wherein:
the metal section comprises a current supplying section to supply current to the light emitting element, and a heat radiation section to radiate heat generated from the light emitting element.

3. The light emitting apparatus according to claim 2, wherein:
the current supplying section is integrated with the heat radiation section.

4. The light emitting apparatus according to claim 1, wherein:
the metal section comprises a thermal expansion coefficient nearly equal to that of the transparent glass section.

5. The light emitting apparatus according to claim 1, wherein:
the metal section comprises a soft metal.

6. The light emitting apparatus of claim 1, wherein said transparent glass section seals the light emitting element.

7. The light emitting apparatus of claim 1, wherein the transparent glass section surrounding the light emitting element further comprises a lens shape.

8. The light emitting apparatus according to claim 1, further comprising:
a submount to which the light emitting element is flip-chip bonded; and
a current supplying section to which the light emitting element is electrically connected through the submount.

9. The light emitting apparatus according to claim 1, further comprising:
a current supplying section to which the light emitting element is electrically connected through a wire, the light emitting element being face-up mounted; and
a heat-resistance member coating the light emitting element and the wire.

10. A light emitting apparatus comprising:
a light emitting element;
a current supplying section on which the light emitting element is mounted and which supplies power to the light emitting element;
a transparent glass section that seals the light emitting element and part of the current supplying section,
wherein the current supplying section and the transparent glass section comprise a material that comprises a thermal expansion coefficient greater than the light emitting element,
wherein the light emitting element is surrounded by the current supplying section and the transparent glass section, and
wherein the transparent glass section and the metal section comprise a ratio in thermal expansion coefficient to the light emitting element in a range of 150% to 500%.

11. The light emitting apparatus according to claim 10, wherein:
the current supplying section comprises a thermal expansion coefficient nearly equal to that of the transparent glass section.

12. The light emitting apparatus according to claim 10, wherein:
the current supplying section comprises a soft metal.

13. The light emitting apparatus according to claim 10, wherein:
the current supplying section comprises a thermal conductivity of 100 $W.m^{-1}.k^{-1}$ or more.

14. The light emitting apparatus according to claim 10, further comprising a submount over which the light emitting element is mounted,
wherein the submount comprises a thermal conductivity of 100 $W.m^{-1}.k^{-1}$ or more.

15. The light emitting apparatus of claim 10, wherein the current supplying section is provided with a reflective surface formed thereon to increase light radiation from the light emitting element through the transparent glass section.

16. A light emitting apparatus comprising:
a light emitting element;
a submount on which the light emitting element is mounted;
a current supplying section that supplies power to the light emitting element;
a transparent glass section that seals the light emitting element, the submount and part of the current supplying section,
wherein the submount comprises an electrical circuit through which power is supplied from the current supplying section to the light emitting element,
wherein the current supplying section and the transparent glass section comprise a material that comprises a thermal expansion coefficient greater than one of the light emitting element and the submount, and
wherein the light emitting element and the submount are surrounded by the current supplying section and the transparent glass section.

17. The light emitting apparatus according to claim 16, wherein:
the current supplying section and the transparent glass section comprise a material that comprises a ratio in thermal expansion coefficient 150% or more greater than the light emitting element or the submount.

18. The light emitting apparatus according to claim 16, wherein:
the current supplying section comprises a thermal expansion coefficient nearly equal to that of the transparent glass section.

19. The light emitting apparatus according to claim 16, wherein:
the current supplying section comprises a soft metal.

20. The light emitting apparatus according to claim 16, wherein:
the current supplying section comprises a thermal conductivity of 100 $W.m^{-1}.k^{-1}$ or more.

21. The light emitting apparatus according to claim 16, wherein:
the submount comprises a thermal conductivity of 100 $W\cdot m^{-1}\cdot k^{-1}$ or more.

22. The light emitting apparatus of claim 16, wherein the current supplying section is provided with a reflective surface formed thereon to increase light radiation from the light emitting element through the transparent glass section.

* * * * *